United States Patent
Pfahnl et al.

(10) Patent No.: US 7,280,356 B2
(45) Date of Patent: Oct. 9, 2007

(54) AIR COOLING ARCHITECTURE FOR ORTHOGONAL BOARD ARCHITECTURES

(75) Inventors: Andreas C. Pfahnl, Goffstown, NH (US); Christopher Heard, Brookline, NH (US)

(73) Assignee: Amphenol Corporation, Wallingford, CT (US)

( * ) Notice: Subject to any disclaimer, the term of this patent is extended or adjusted under 35 U.S.C. 154(b) by 209 days.

(21) Appl. No.: 11/011,838

(22) Filed: Dec. 14, 2004

(65) Prior Publication Data

US 2006/0126292 A1    Jun. 15, 2006

(51) Int. Cl.
*H05K 7/20*    (2006.01)
(52) U.S. Cl. .............. 361/695; 361/690; 361/694; 361/721; 361/724; 454/184
(58) Field of Classification Search ............ None
See application file for complete search history.

(56) References Cited

U.S. PATENT DOCUMENTS

| | | | | |
|---|---|---|---|---|
| 4,935,845 A | * | 6/1990 | Schwehr et al. ......... | 361/694 |
| 6,163,454 A | * | 12/2000 | Strickler ................. | 361/695 |
| 6,388,879 B1 | * | 5/2002 | Otaguro et al. .......... | 361/695 |
| 6,400,567 B1 | * | 6/2002 | McKeen et al. .......... | 361/695 |
| 6,768,640 B2 | * | 7/2004 | Doblar et al. ............ | 361/695 |
| 7,088,583 B2 | * | 8/2006 | Brandon et al. .......... | 361/694 |

OTHER PUBLICATIONS

Advanced TCA; PICMG 3.0 Short Form Specification, Jan. 2003.
U.S. Appl. No. 10/954,865, Pfahnl, A. et al.
Virtual Midplane Realizes Ultrafast Card Interconnects, Michael Fowler, ED Online ID#1771, Dec. 9, 2002. Downloaded Nov. 11, 2004 from http://www.elecdesign.com/Articles/Print.cfm?ArticleID=1771.
Model 6676 ForeFront Xtreme Chassis Assembly, User Guide, Document No. 120031U Rev.A, Patton Electronics Co., Dec. 18, 2003. Downloaded Dec. 8, 2004 from http://www.patton.com/manuals/6676.pdf.

* cited by examiner

*Primary Examiner*—Boris Chervinsky
(74) *Attorney, Agent, or Firm*—Blank Rome LLP

(57) ABSTRACT

An electronic system is disclosed that uses air for cooling first and second orthogonally oriented arrays of parallel circuit boards. Air is drawn into the front of the system, passes alongside the circuit boards in the first array, takes a 90-degree turn, continues over the circuit boards in the second array, and takes another 90-degree turn to exhaust through the rear of the system. The circuit boards in the first array are cooled through a separate airflow path, which preferably also runs front-to-rear.

22 Claims, 3 Drawing Sheets

AIR COOLING ARCHITECTURE FOR ORTHOGONAL BOARD ARCHITECTURES

CROSS-REFERENCES TO RELATED APPLICATIONS

Not Applicable.

STATEMENT REGARDING FEDERALLY SPONSORED RESEARCH OR DEVELOPMENT

Not Applicable.

REFERENCE TO MICROFICHE APPENDIX

Not Applicable

BACKGROUND

1. Field of the Invention

This invention relates generally to electronic assemblies, and, more particularly, to arrangements for cooling arrays of electronic circuit boards.

2. Description of Related Art

Electronic assemblies are commonly manufactured in the form of circuit boards that plug into a backplane. Numerous electronic components are attached to each circuit board and are connected together via conductive traces or wires. Each circuit board generally has one or more connectors at one end, which are designed to mate with respective connector(s) on the backplane. Different circuit boards can be plugged into different standard locations, or "slots," of the backplane, substantially in parallel. The backplane generally includes traces or wires for establishing connections between the different circuit boards that plug into the backplane.

The circuit boards and the backplane are generally housed together within an enclosure called a "card cage" or "chassis." The chassis generally also houses power supplies for energizing the circuit boards and air movers such as fans or blowers for cooling the circuit boards. The chassis also typically includes card guides, which form channels within which circuit boards can slide to ensure that they are inserted into backplane connectors with proper spacing and alignment.

Electronic systems are being developed that provide orthogonal arrays of circuit boards. Each array includes circuit boards oriented in parallel; however, the different arrays are orthogonal to each other. An example of this type of system is disclosed in U.S. patent application Ser. No. 10/954,865, entitled, "Electronic System with Non-Parallel Arrays of Circuit Board Assemblies," which is hereby incorporated by reference.

With orthogonal arrays of circuit boards, one array may dissipate relatively little power and may be air cooled, whereas another array may dissipate relatively higher power and may be liquid cooled.

We have recognized that, where possible, it is strongly preferred for both arrays of circuit boards to be air cooled. Air cooling is preferred because it reduces cost and complexity as compared with liquid cooling. What is desired, therefore, is an effective way of air cooling orthogonal arrays of circuit boards.

SUMMARY

In accordance with an embodiment of the invention, an electronic system includes a first region for housing a plurality of first circuit boards and a second region for housing one or more second circuit boards, wherein the first circuit boards are arranged orthogonally with the second circuit board(s) and electrically connected thereto. The system includes an air cooling path for cooling the second circuit board(s). The air cooling path includes first and second portions. The first portion extends parallel to the first circuit boards, and the second portion includes at least part of each of the second circuit board(s).

BRIEF DESCRIPTION OF THE DRAWINGS

The ensuing description will be better understood by reference to the accompanying drawings, in which—

DETAILED DESCRIPTION OF THE PREFERRED EMBODIMENT

As used throughout this document, words such as "comprising," "including," and "having" are intended to set forth certain items, steps, elements, or aspects of something in an open-ended fashion. Unless a specific statement is made to the contrary, these words do not indicate a closed-ended list to which additional things cannot be added.

Figure 1:
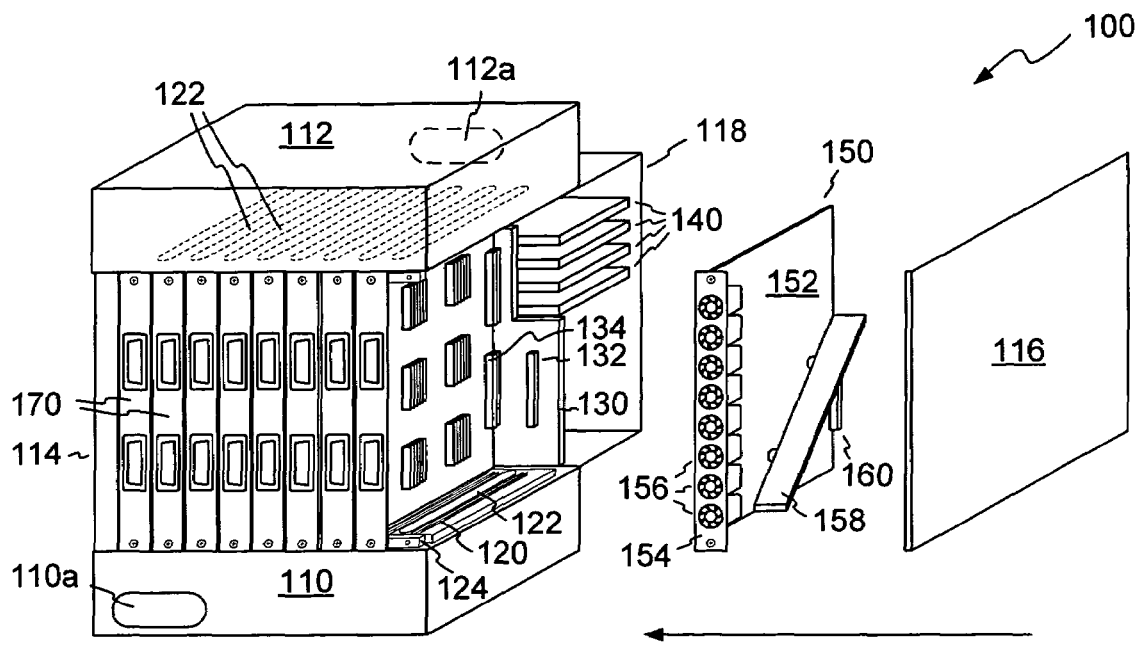
FIG. 1 shows a first partially exploded, front view of an electronic system according to an embodiment of the invention.
Figure 2:
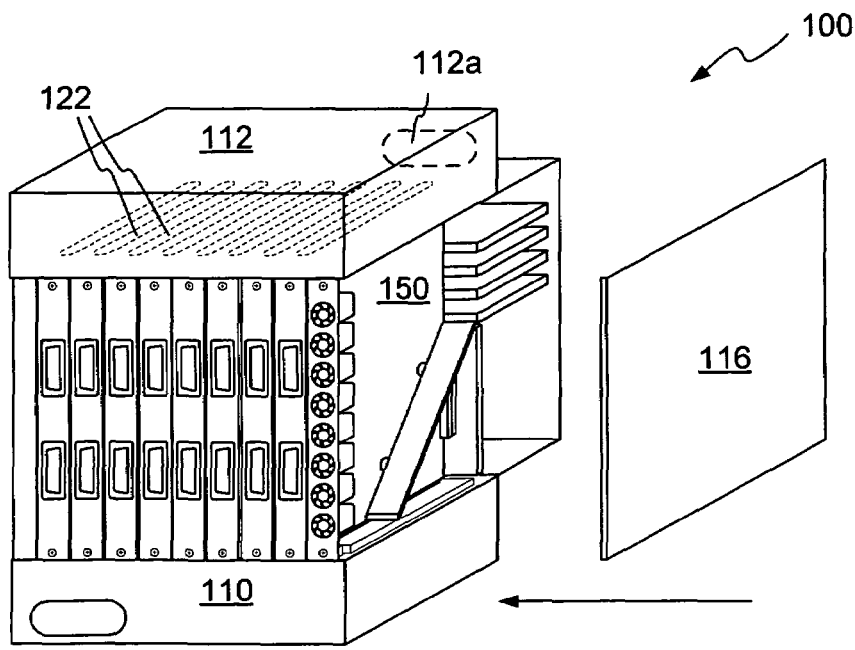
FIG. 2 shows a second partially exploded, front view of an electronic system according to an embodiment of the invention.

FIGS. 1-5 show an electronic system 100 configured in accordance with an embodiment of the invention. As best shown in FIG. 1, the electronic system 100 includes a first array of parallel circuit boards 170 plugged into a front surface of a backplane 130 and a second array of parallel circuit boards 140 is plugged into a rear surface of the backplane 130. The circuit boards 170 are oriented orthogonally with the circuit boards 140. An array of connectors 132 at the front of the backplane is arranged for mating with connectors 134 of the circuit boards 170. Similarly, an array of connectors 634 at the rear of the backplane is arranged for mating with connectors 644 of the circuit boards 140 (see FIG. 6).

Preferably, each circuit board 140 extends across the entire width of the array of circuit boards 170. Connections between the circuit boards 140 and the circuit boards 170 are preferably made substantially straight though the backplane 130. Connection paths between the circuit boards 140 and 170 are thus substantially equidistant.

The circuit boards 170 are preferably inserted into predefined slots of the system 100. To ensure proper spacing and orientation, the system 100 preferably includes upper and lower card guides 120 (only lower card guides shown). The top and bottom edges of the circuit boards 170 can slide in grooves defined by the card guides, for plugging the circuit boards 170 into the backplane 130 or for unplugging them from the backplane. When plugging circuit boards 170 into the backplane 130, the connectors 134 on the circuit boards 170 make blind-mate connections with the connectors 132 on the backplane.

Figure 6:
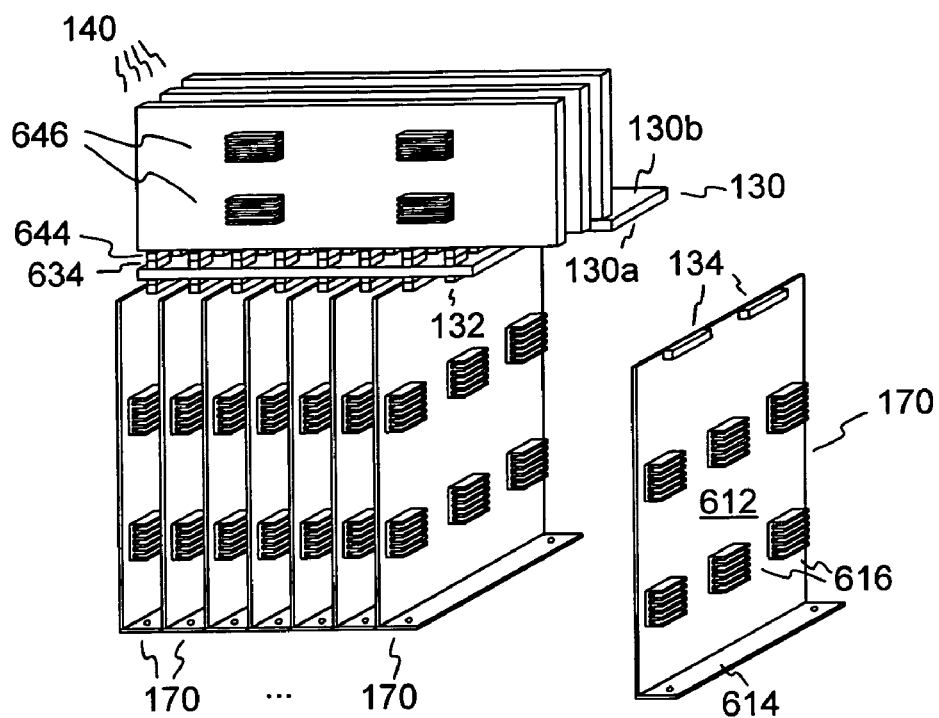
FIG. 6 shows a top view of one configuration of orthogonal circuit board arrays that may be used with the electronic system of FIGS. 1-5.

Each circuit board 170 has a front panel 614 (see FIG. 6). Fasteners, such as screws, are used to securely attach the circuit boards 170 to the system 100. The screws preferably engage threaded holes in upper and lower rails 124, which run substantially across the width of the system.

The system 100 includes two distinct air cooling paths: a first cooling path for cooling the circuit boards 140 and a second cooling path for cooling the circuit boards 170. The first cooling path includes a blower assembly 150. The blower assembly 150 draws in air from the front of the system 100 and directs it to the circuit boards 140. A rear cover 118 extends over and partially encloses the circuit boards 140. Air flows across the circuit boards 140 from right to left (from the perspective of FIGS. 1-3). Air preferably is exhausted through the rear of the system, via an opening 118a in the rear cover 118 (see FIGS. 4 and 5). Preferably, the backplane has a cutout in the upper right corner (from the perspective of FIGS. 1-3) to allow air to pass from the region in front of the backplane 130 to the region behind the backplane.

The second cooling path cools the circuit boards 170. The second cooling path includes an inlet plenum 110 and an outlet plenum 112. An air inlet 110a is preferably formed at the front of the inlet plenum 110. An air outlet 112a is preferably formed at the rear of the outlet plenum 112.

The inlet plenum 110 and the outlet plenum 112 preferably both include apertures 122. These apertures 122 direct air across and between different circuit boards 170.

The inlet plenum 110 preferably includes an air mover, such as one or more fans. Alternatively, the air mover can be disposed in the outlet plenum 112.

During operation, air is drawn into the inlet plenum 110 through the air inlet 110a. It is then passed through the apertures 122 of the inlet plenum 110, across the circuit boards 170, through the apertures 122 of the outlet plenum 112, and out of the air outlet 112a. The desired cooling is achieved via the movement of air across the circuit boards 170.

As best seen in FIG. 1, the blower assembly 150 preferably has the same size and shape as the circuit boards 170. It preferably includes a support 152. The support 152 is preferably a printed circuit board; however, it may also be any other suitable material, such as sheet metal or plastic The blower assembly 150 preferably also includes a front panel 154, a guide vane 158, and a backplane connector 160. The blower assembly 150 is preferably modular and can be easily removed for servicing. The blower assembly 150 plugs into a slot of the system 100 by sliding in the card guides 120 and makes a blind mate connection with the backplane 130. Fasteners, such as screws, are preferably used to securely attach the blower assembly 150 to the upper and lower rails 124, in a manner similar to the way in which the circuit boards 170 attach.

The front panel 154 is preferably a piece of metal or plastic that attaches to the support 152. If the support 152 is made of a bendable or formable material, such as sheet metal or plastic, the front panel can also be created by bending over (or forming) a section of the support 152 at a right angle. The front panel 154 preferably includes one or more openings into which one or more fans 156 are mounted. In the preferred embodiment, eight fans 156 are provided in eight separate openings. We have found that a particularly suitable fan for this application is the model GFB0412 from Delta Electronics, Inc. This fan measures 40×40×56 mm, and thus fits in a 1RU standard slot (1RU=44.5 mm).

The guide vane 158 is preferably a sheet of metal or plastic attached to the supper 152. During operation, the guide vane 158 concentrates airflow toward the rear of the blower assembly 150. This has the effect of reducing pressure losses as air crosses into the spaces between the circuit boards 140.

The backplane connector 160 is preferably identical to the connectors 134 on the circuit boards 170. When the blower assembly 150 is plugged in, the connector 160 makes a blind mate connection with a connector 132 on the backplane. From this connection, the blower assembly 150 receives power for energizing the fans 156. Preferably, conductive traces within the substrate 152 convey power from the connector 160 to the fans 156. Optionally, the fans 156 can exchange communication and control signals with the backplane. These signals may include, for example, input signals to the fans for programming desired RPM, and feedback signals from the fans for indicating actual RPM.

Figure 3:
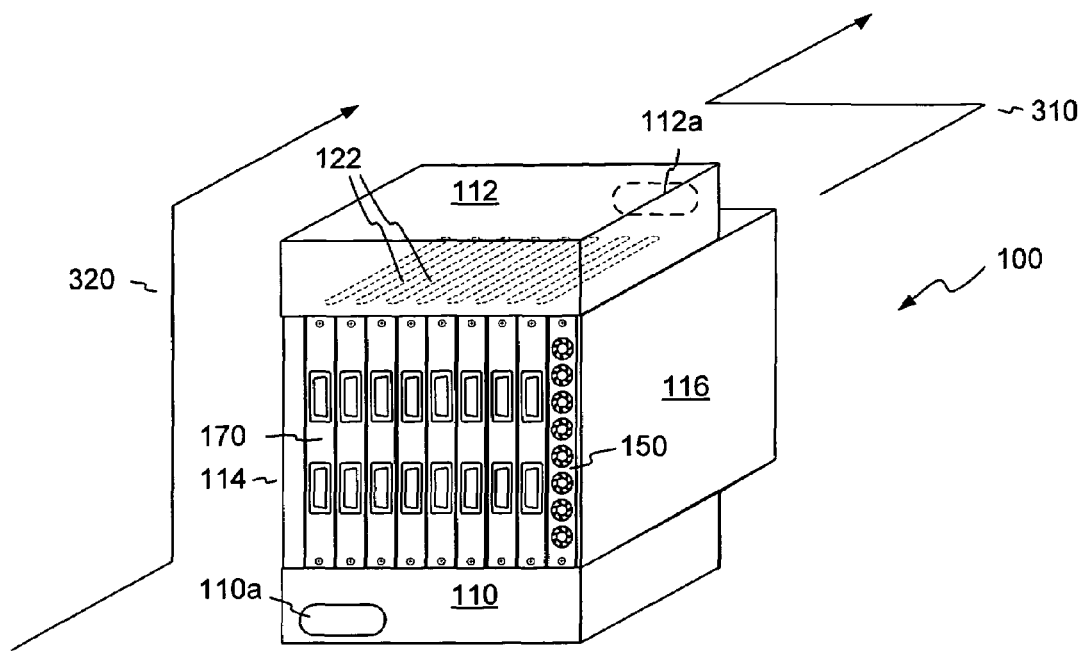
FIG. 3 shows a fully assembled, front view of an electronic system according to an embodiment of the invention.
Figures 4, 5:
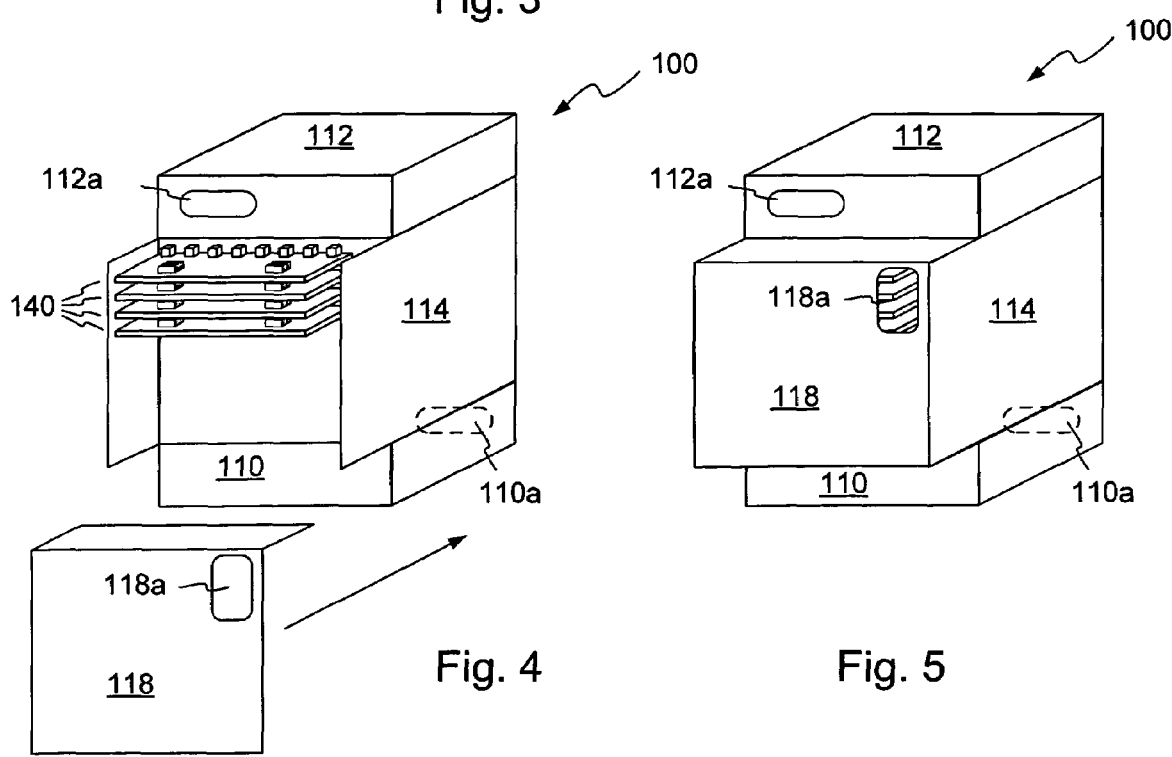
FIG. 4 shows a partially exploded, rear view of an electronic system according to an embodiment of the invention.
FIG. 5 shows a fully assembled, rear view of an electronic system according to an embodiment of the invention.

The system 100 provides front-to-back airflow for both the first and second cooling paths. As shown in FIG. 3, air for the first cooling path preferably follows an S-shaped course, as designated by arrow 310. Air enters through the front of the system 100 alongside the circuit boards 170. The air is passed toward the rear of the system, takes a right-angle turn to the left, and then passes across the rear of the system. It then takes a right-angle turn to the right and exits through the rear of the system 100.

Air for the second cooling path also follows an S-shaped course, designated by arrow 320. Air enters the system 100 though the lower front, passes upwardly between the circuit boards 170, and exits the system from the upper rear.

One particularly advantageous application of the system 100 is in the area of telecom switching. In this application, the circuit boards 170 are preferably line cards and the circuit boards 140 are preferably switch cards. Line cards are used to connect with various nodes of a telecom system, and switch cards are used to route these nodes together. Very often, multiple racks of telecom systems employing line cards and switch cards are set up in facilities called "data centers."

We have recognized that the front-to-back airflow of the system 100 is particularly well suited for data centers. Data centers are customarily arranged with a central passageway and with systems placed to the left and right of the passageway. An air conditioner generally pumps cool air into the passageway in front of the systems, and draws in spent air from behind the systems. In this conventional arrangement, front-to-back airflow of the system 100 aligns with the airflow direction in the data centers, and thus promotes cooling efficiency.

Figure 7:
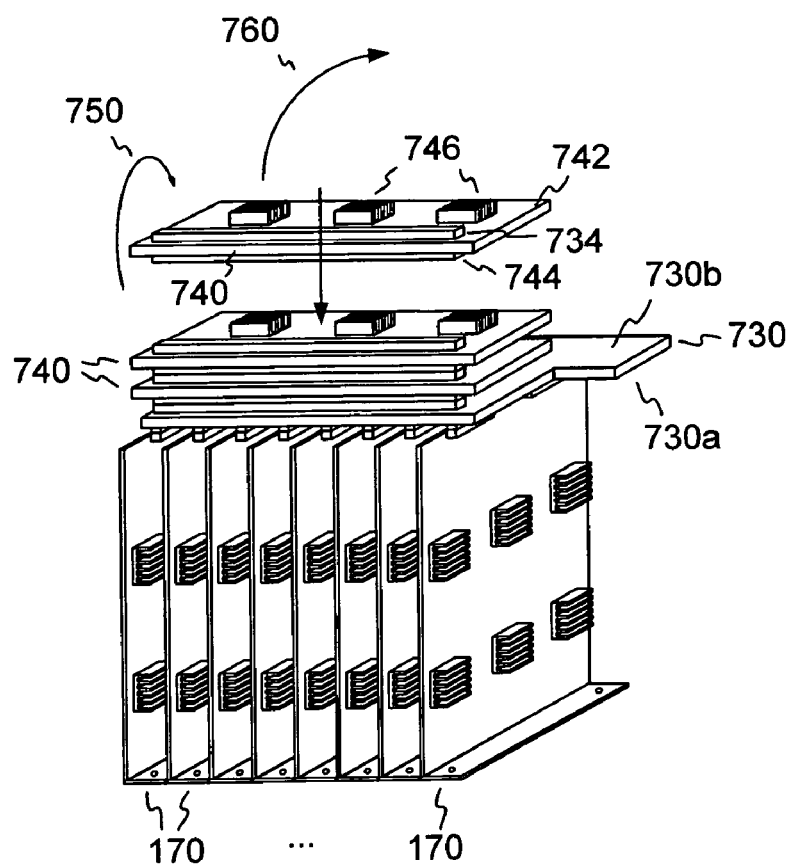
FIG. 7 shows a top view of another configuration of orthogonal circuit board arrays that may be used with the electronic system of FIGS. 1-5.

FIGS. 6 and 7 show two examples of orthogonally oriented circuit board arrays that can be cooled according to the principles set forth herein. FIG. 6 shows a top view of the configuration depicted in FIGS. 1-5. FIG. 7 shows a top view of an alternative arrangement. Either arrangement may be used in the system depicted in FIGS. 1-5 and should be understood to fall within the scope of the invention. Additional arrangements of orthogonal arrays of circuit boards may be used, as well.

As shown in FIG. 7, an array of circuit boards 740 is both orthogonal with the circuit boards 170 and orthogonal with the backplane (730). Circuit boards 740 are stacked one on top of the other. Each circuit board 740 has a lower connector 744 for connecting with the board below it in the stack (or to the backplane), and an upper connector 734 for connecting with a circuit board 740 from above.

As with the arrangement in FIG. 6, each circuit board 740 preferably extends across the entire width of the array of circuit boards 170. Connections between the circuit boards 740 and 170 are preferably made straight through the backplane.

Having described certain embodiments, numerous alternative embodiments or variations can be made. For example, as shown and described, a backplane is used to interconnect the circuit boards 170 and 140. This is not required, however. Alternatively, the backplane can be omitted and other hardware, such as discrete connectors, can be used for interconnecting the orthogonal arrays of circuit boards.

As shown and described, the blower assembly 150 has the same size and shape as the circuit boards 170. Alternatively, the blower assembly 150 can have a different size and shape. Although the blower assembly 150 preferably fits into a slot of the system 100, this is not required.

In the preferred embodiment, the circuit boards 170 are a standard size (1RU). This is not required, however. The size and shape of the circuit boards can be either standard or custom.

The connector used for connecting the blower assembly to the backplane can be different from the ones used by the circuit boards 170. Since the blower assembly 150 in its simplest form requires only power and ground, it is possible to reduce cost by using a simpler and less expensive connector.

It is not required that the blower assembly 150 make blind mate connections with the backplane. It can alternatively connect to the backplane using a manual cabling arrangement. If a blind mate connection to the backplane is not used, a corner of the backplane need not be cut away, and the backplane can simply end at the slot immediately adjacent to the slot in which the blower assembly 150 is installed.

Portions of the blower assembly 150 can be integrated with the chassis. For example, the guide vane 158 can be built into the side 114 or 116 of the chassis rather than being provided as part of the blower assembly 150.

According to one variation, the front panel 154 and fans 156 can be provided without the substrate as a removable module. A cable can extend directly from the fans 156 to connect to a power source.

As shown and described, the blower assembly 150 is installed in the right-most slot of the system 100, and air is exhausted at the back left. Alternatively, the blower module can be installed in the left-most slot and air can be exhausted at the back right.

In general, the designations "front," "rear," "left," and "right" are used herein to designate relative positions. These designations should not be construed as absolute positions.

It is not strictly necessary that air from the blower assembly 150 be exhausted from the rear of the system 100. Alternatively, it can be exhausted from the side opposite the side at which the blower assembly is installed.

As shown and described, the blower assembly includes eight fans 156, which are attached in a line to the front panel 154. More or fewer fans can be used. In addition, fans need not be attached to the front panel 154. Alternatively, fans can be positioned at any location in the second cooling path, including at the exhaust opening 118*a*. Multiple groups of fans can be used. For example, a first group can be mounted in a line on the front panel 154 and a second group can be attached elsewhere on the substrate, closer to the backplane.

As shown and described, the cooling path for cooling the second circuit boards 140/740 directs air across the entire top surface of each second circuit board. This is not required, however. Alternatively, air can be made to flow over only a portion of each circuit board.

The invention has been described herein in connection with telecom applications. However, the invention may be applied in a variety of applications, such as those employing server blades.

Those skilled in the art will therefore understand that various changes in form and detail may be made to the embodiments disclosed herein without departing from the scope of the invention.

What is claimed is:

1. An electronic system, comprising:
    a first region constructed and arranged for holding a plurality of first circuit board assemblies in a parallel orientation;
    a second region, disposed proximate the first region, constructed and arranged for holding at least one second circuit board assembly in an orientation that is orthogonal to the plurality of first circuit board assemblies;
    a plurality of conductive pathways between the first region and the second region for interconnecting the plurality of first circuit board assemblies with the at least one second circuit board assembly; and
    an air cooling path for cooling the at least one second circuit board assembly, having a first portion substantially orthogonal to the plurality of conductive pathways, a second portion substantially orthogonal to the first portion, and a third portion substantially parallel to the first portion, wherein at least part of each at least one second circuit board assembly is disposed in the second portion of the air cooling path.

2. An electronic assembly as recited in claim 1, wherein the first portion of the air cooling path has an air inlet and the third portion of the air cooling path has an air outlet.

3. An electronic assembly as recited in claim 2, further comprising a blower disposed in the air cooling path between the inlet and the outlet, for moving air between the inlet to the outlet.

4. An electronic assembly as recited in claim 3, wherein the blower is disposed in the first portion of the air cooling path.

5. An electronic assembly as recited in claim 1, further comprising: a backplane having a front surface and a back surface, wherein the plurality of first circuit board assemblies are attached to the front surface of the backplane and each at least one second circuit board assembly is attached to the back surface of the backplane, and wherein the backplane includes the plurality of conductive pathways.

6. An electronic assembly as recited in claim 5, wherein the second portion of the air cooling path is disposed behind the backplane.

7. An electronic assembly as recited in claim 1, wherein the plurality of first circuit board assemblies are installed in N consecutive slot locations disposed in the first region, and wherein the first portion of the air cooling path is disposed in one of the N slot locations.

8. An electronic assembly as recited in claim 7, wherein the slot location including the first portion of the air cooling path is one of the first slot location and the Nth slot location of the first region.

9. An electronic assembly as recited in claim 7, further comprising a front panel attached to the first region at the slot location including the first portion of the air cooling path.

10. An electronic assembly as recited in claim 9, wherein the front panel has at least one air inlet for providing air to the air cooling path.

11. An electronic assembly as recited in claim 10, further comprising a blower attached to the front panel adjacent to the at least one air inlet.

12. An electric assembly as recited in claim 11, wherein the blower comprises a plurality of fans.

13. An electronic assembly as recited in claim 10, further comprising a guide vane disposed behind the front panel for concentrating a flow of air across the at least one second circuit board assembly.

14. The electronic system of claim 1, wherein the air cooling path is substantially S-shaped.

15. An electronic system, comprising:
an enclosure having a front and a back;
a backplane disposed in the enclosure and having a front and a back respectively facing the same directions as the front and back of the enclosure;
a plurality of first circuit board assemblies arranged in parallel within the enclosure and engaging the front of the backplane;
at least one second circuit board assembly within the enclosure engaging the back of the backplane and oriented orthogonally with each of the plurality of first circuit board assemblies;
a first opening proximate the front of the enclosure;
a second opening proximate the rear of the enclosure; and
an air cooling path between the first opening and the second opening for cooling the at least one second circuit board assembly, the air cooling path having a portion substantially parallel to the backplane.

16. An electronic system as recited in claim 15, wherein the enclosure has a first side and a second side, the first opening is proximate the first side, and the second opening is proximate the second side.

17. An electronic system as recited in claim 16, wherein the air cooling path comprises: a first portion coupled to the first opening and extending parallel to the plurality of first circuit board assemblies; and a second portion coupled to the first portion and to the second opening and extending parallel to the at least one second circuit board assembly.

18. An electronic system as recited in claim 17, wherein at least part of each at least one second circuit board assembly is disposed in the second portion.

19. An electronic system as recited in claim 15, wherein the air cooling path is a first air cooling path, and further comprising a second air cooling path for cooling the plurality of first circuit board assemblies.

20. An electronic system as recited in claim 19, wherein the second air cooling path comprises: an inlet; an outlet; and an air mover for blowing air from the inlet, across the plurality of first circuit board assemblies, and out of the outlet.

21. An electronic system, comprising:
a front and a rear;
a first array of parallel circuit boards proximate the front of the system;
a second array of parallel circuit boards oriented orthogonally with the circuit boards in the first array and disposed behind the first array;
an air cooling path having an air inlet in the front of the system and an air outlet in the rear of the system, a first portion extending from the air inlet alongside the first array, a second portion substantially orthogonal to the first portion, and a third portion substantially orthogonal to the second portion extending to the air outlet along the rear of the system and at least partially including the circuit boards of the second array.

22. In an electronic system having a backplane with a plurality of first circuit board assemblies connected to a front surface of the backplane and at least one circuit board assembly connected to a back surface of the backplane, a method of cooling at least one circuit board assembly connected to the back surface of the backplane, comprising:
A) receiving air into the electronic system from a region in front of the backplane substantially orthogonal to the backplane;
B) conducting the air within the electronic system to a region behind the backplane;
C) passing the air across the at least one circuit board assembly substantially parallel to the backplane; and
D) exhausting the air from the electronic system to a region behind the backplane substantially orthogonal to the backplane.

* * * * *

UNITED STATES PATENT AND TRADEMARK OFFICE
CERTIFICATE OF CORRECTION

| | | |
|---|---|---|
| PATENT NO. | : 7,280,356 B2 | Page 1 of 1 |
| APPLICATION NO. | : 11/011838 | |
| DATED | : October 9, 2007 | |
| INVENTOR(S) | : Andreas Pfahnl et al. | |

It is certified that error appears in the above-identified patent and that said Letters Patent is hereby corrected as shown below:

At column 2, line number 60, please delete the word "though" and substitute therein instead the word --through--

At column 4, line number 34, please delete the word "though" and substitute therein instead the word --through--

Signed and Sealed this
Twenty-ninth Day of March, 2011

David J. Kappos
*Director of the United States Patent and Trademark Office*